(12) United States Patent
Barlocchi et al.

(10) Patent No.: US 9,105,690 B2
(45) Date of Patent: Aug. 11, 2015

(54) PROCESS FOR MANUFACTURING A SEMICONDUCTOR WAFER HAVING SOI-INSULATED WELLS AND SEMICONDUCTOR WAFER THEREBY MANUFACTURED

(75) Inventors: Gabriele Barlocchi, Cornaredo (IT); Pietro Corona, Milan (IT); Flavio Francesco Villa, Milan (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 364 days.

(21) Appl. No.: 13/023,039

(22) Filed: Feb. 8, 2011

(65) Prior Publication Data
US 2011/0133186 A1 Jun. 9, 2011

Related U.S. Application Data

(62) Division of application No. 11/879,738, filed on Jul. 17, 2007, now Pat. No. 7,906,406.

(30) Foreign Application Priority Data

Jul. 17, 2006 (EP) .................................... 06425494

(51) Int. Cl.
H01L 29/08 (2006.01)
H01L 21/762 (2006.01)
H01L 21/768 (2006.01)

(52) U.S. Cl.
CPC ...... *H01L 21/76264* (2013.01); *H01L 21/7682* (2013.01)

(58) Field of Classification Search
CPC ...................... H01L 21/76264; H01L 21/7682
USPC ............ 257/48, 305, E29.029, 522; 438/404, 438/405, 413, 429, 442, 444
See application file for complete search history.

(56) References Cited

U.S. PATENT DOCUMENTS 5,801,406 A * 9/1998 Lubow et al. ................. 257/202
6,630,714 B2 10/2003 Sato et al.
(Continued)

FOREIGN PATENT DOCUMENTS

| EP | 1073112 | 1/2001 |
|----|---------|--------|
| EP | 1324382 | 7/2003 |
| EP | 1480266 | 11/2004 |

OTHER PUBLICATIONS

T. Sato et al., "A New Substrate Engineering for the Formation of Empty Space in Silicon (ESS) Induced by Silicon Surface Migration", IEDM 1999, pp. 517-520.

(Continued)

*Primary Examiner* — Mohammad Islam
*Assistant Examiner* — John P Dulka
(74) *Attorney, Agent, or Firm* — Gardere Wynne Sewell LLP

(57) ABSTRACT

A process for manufacturing a semiconductor wafer including SOI-insulation wells includes forming, in a die region of a semiconductor body, buried cavities and semiconductor structural elements, which traverse the buried cavities and are distributed in the die region. The process moreover includes the step of oxidizing selectively first adjacent semiconductor structural elements, arranged inside a closed region, and preventing oxidation of second semiconductor structural elements outside the closed region, so as to form a die buried dielectric layer selectively inside the closed region.

21 Claims, 11 Drawing Sheets

(56) References Cited

U.S. PATENT DOCUMENTS

| | | |
|---|---|---|
| 6,720,606 B1 | 4/2004 | Nitayama et al. |
| 6,774,395 B1* | 8/2004 | Lin et al. ............ 257/48 |
| 6,777,708 B1* | 8/2004 | Lin et al. ............ 257/48 |
| 6,933,590 B2 | 8/2005 | Yamada et al. |
| 7,678,600 B2* | 3/2010 | Villa et al. ............ 438/48 |
| 2004/0058506 A1* | 3/2004 | Fukuzumi ............ 438/422 |
| 2005/0133081 A1 | 6/2005 | Amato et al. |
| 2005/0208696 A1* | 9/2005 | Villa et al. ............ 438/53 |
| 2005/0282019 A1* | 12/2005 | Fukushima et al. ............ 428/428 |
| 2006/0113598 A1* | 6/2006 | Chen et al. ............ 257/347 |

OTHER PUBLICATIONS

European Search Report for European Patent Application No. EP06425494, dated Jan. 11, 2007.

* cited by examiner

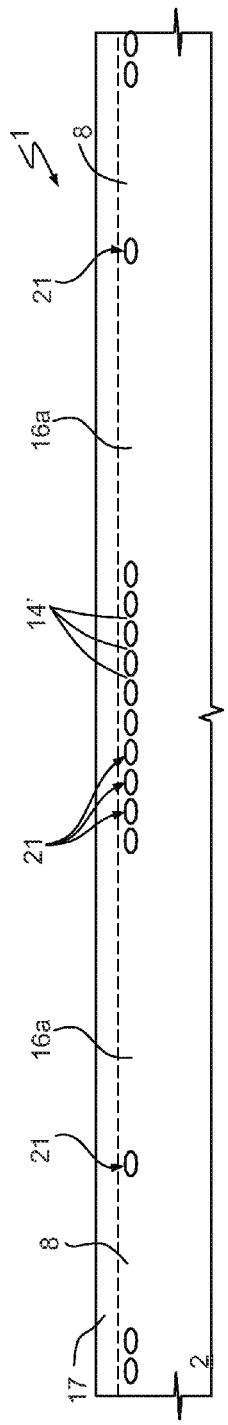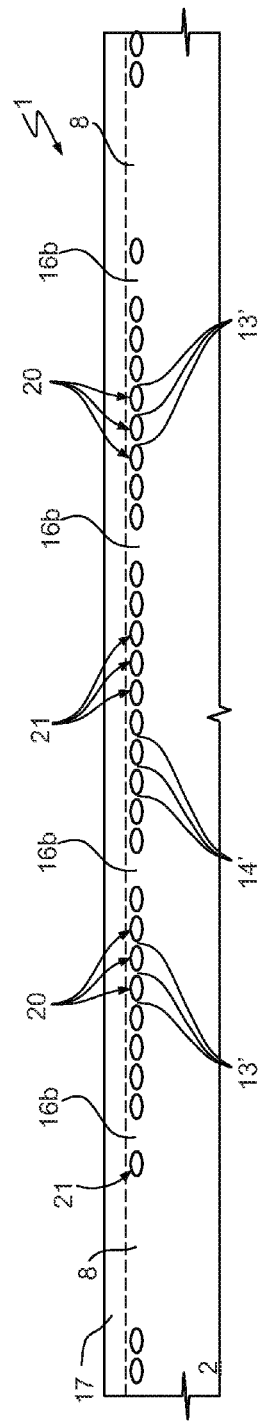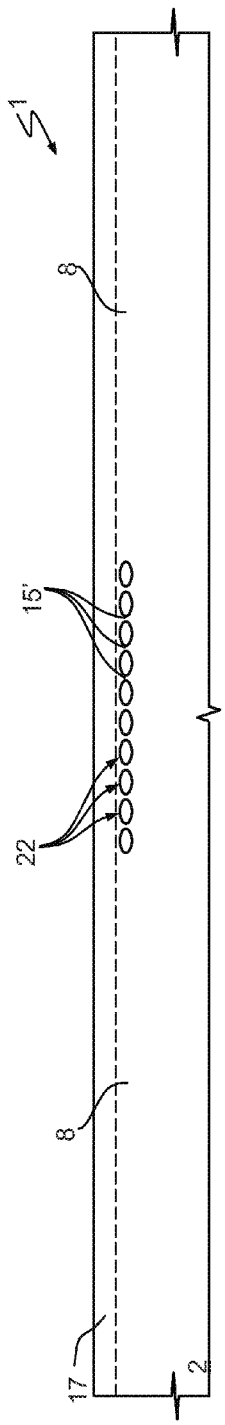

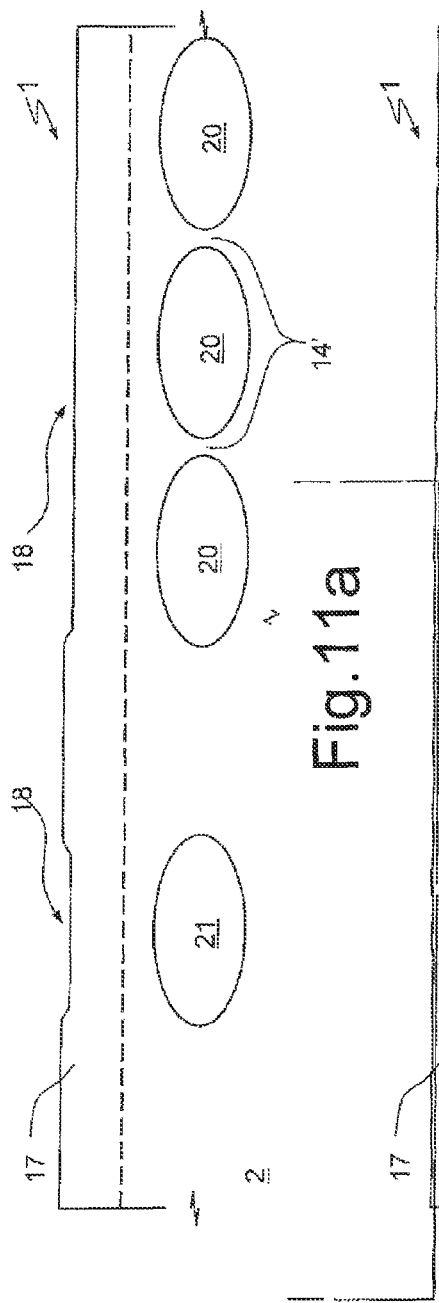
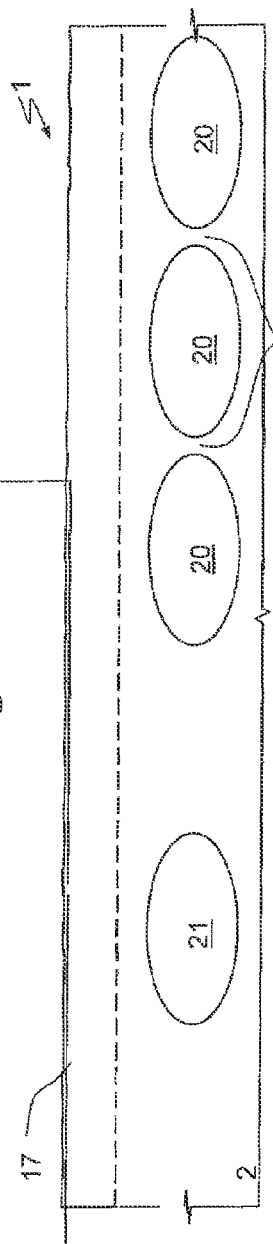
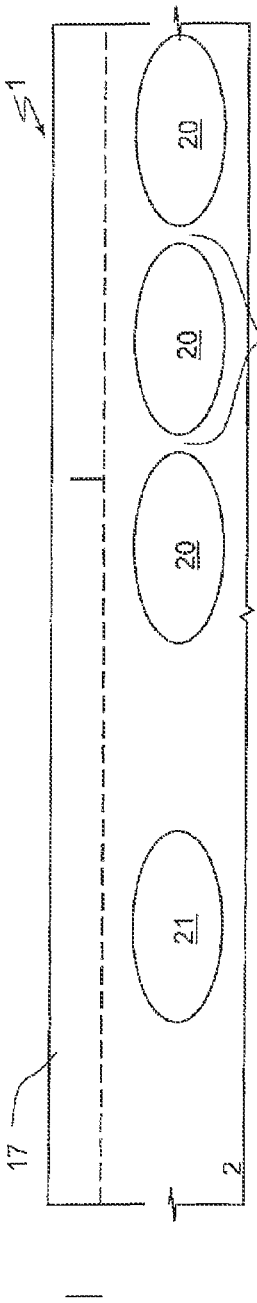

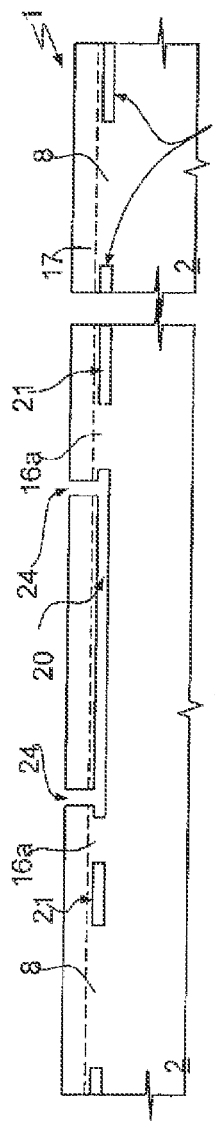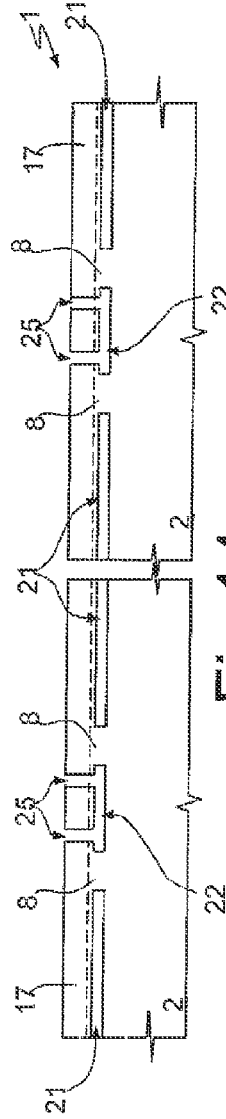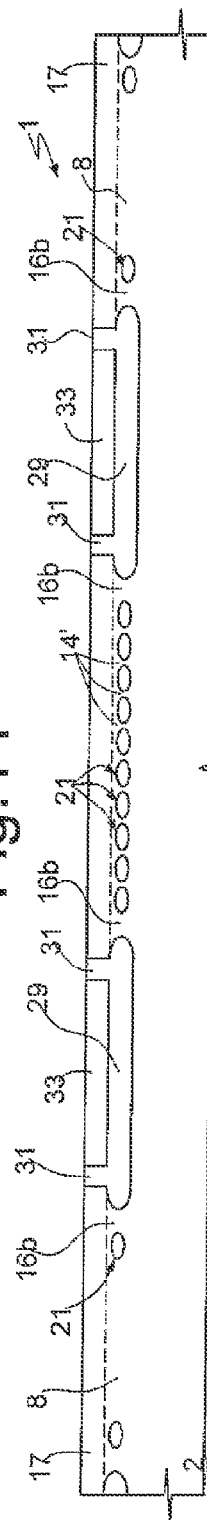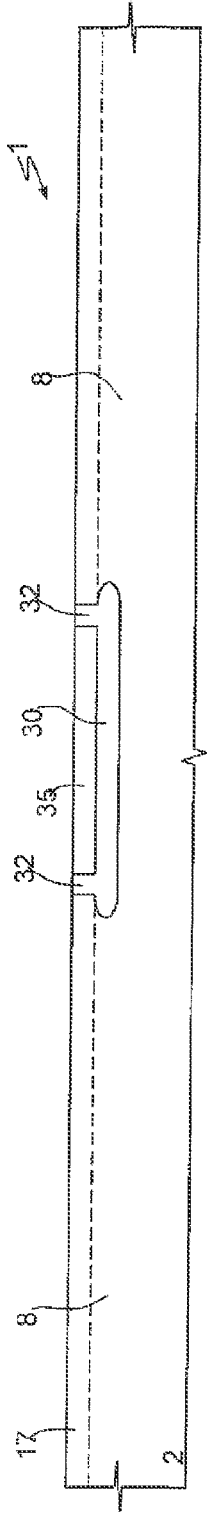

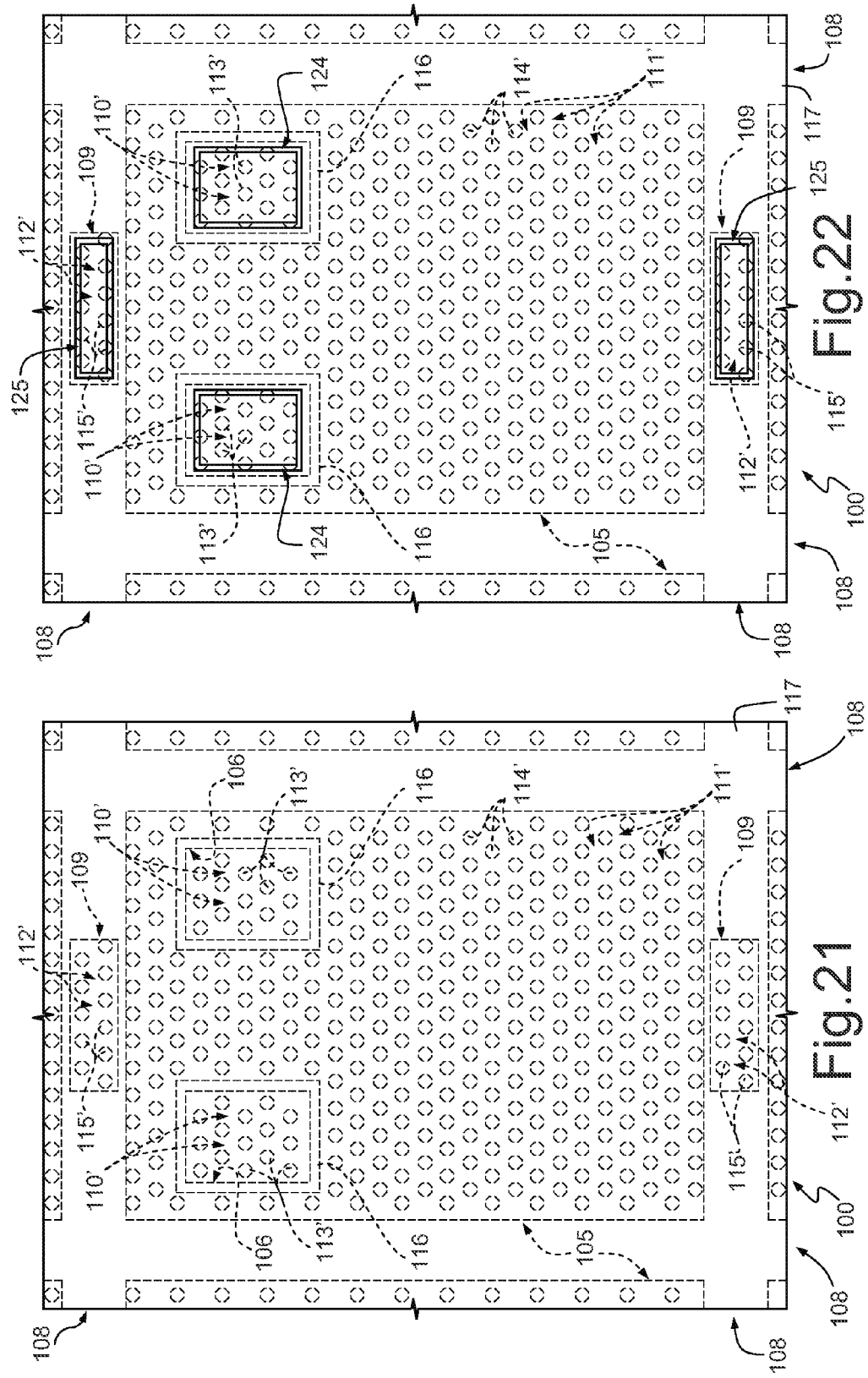

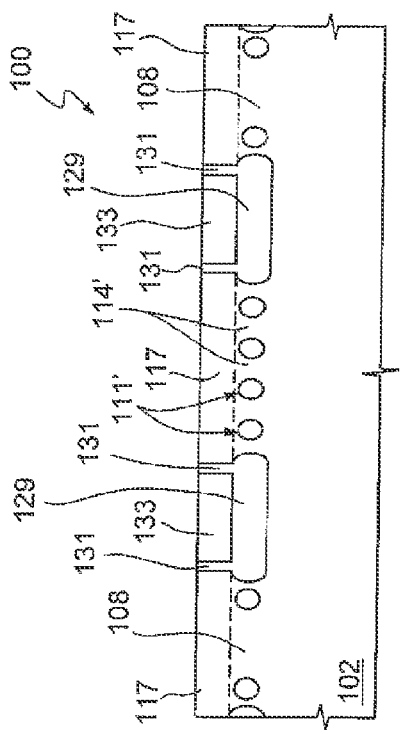
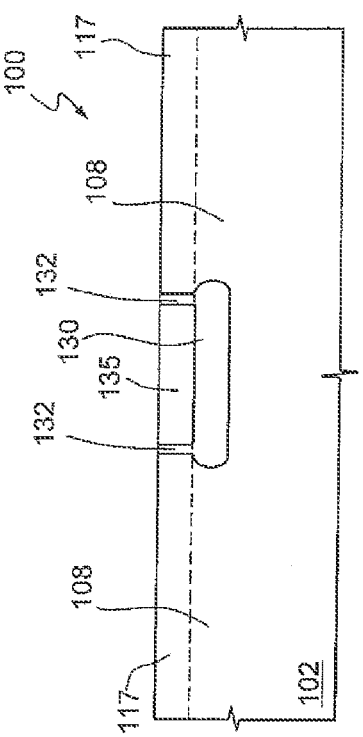
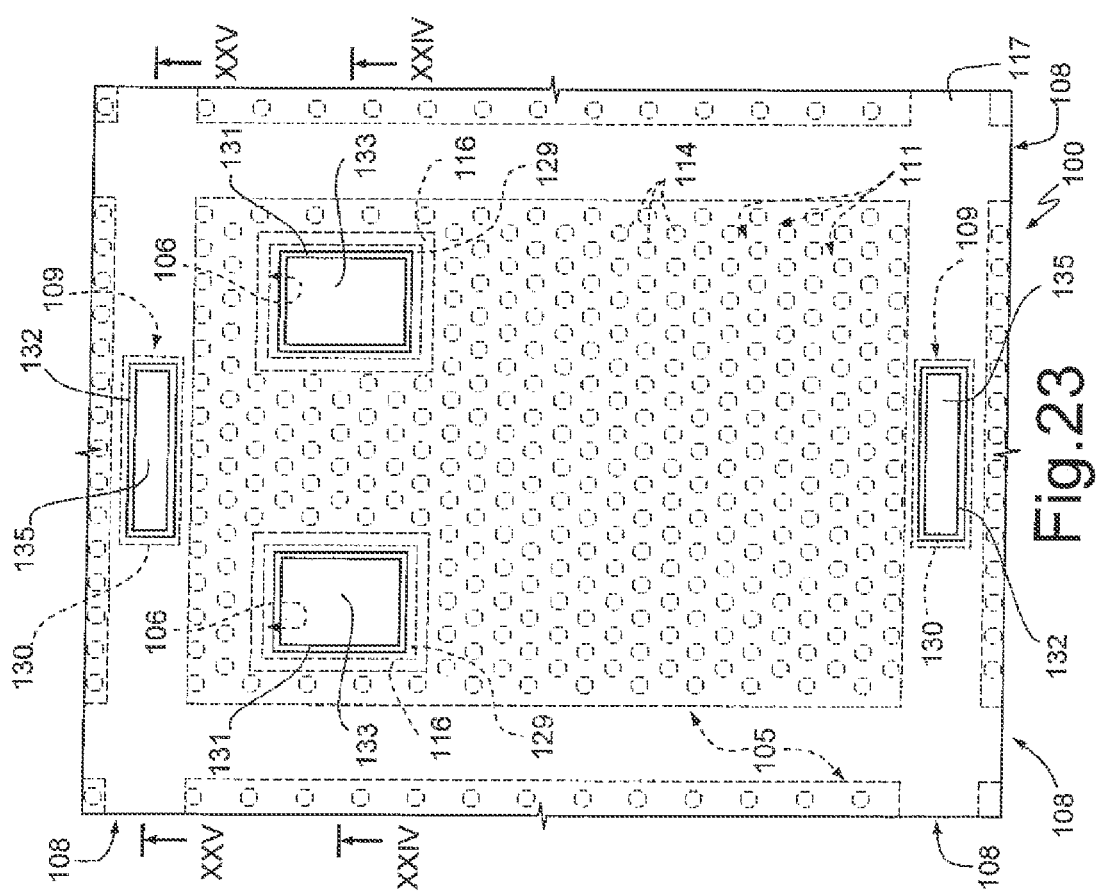

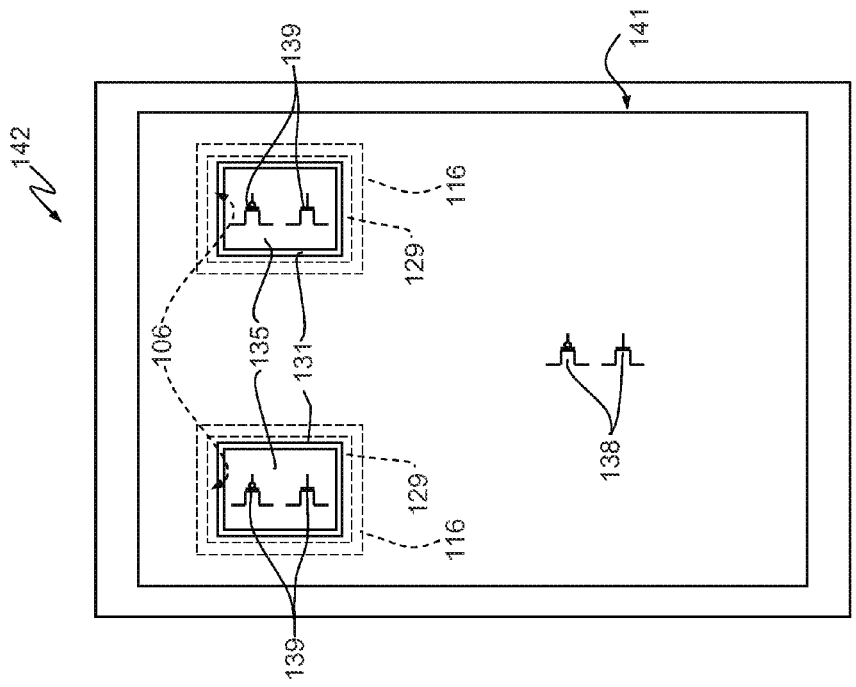
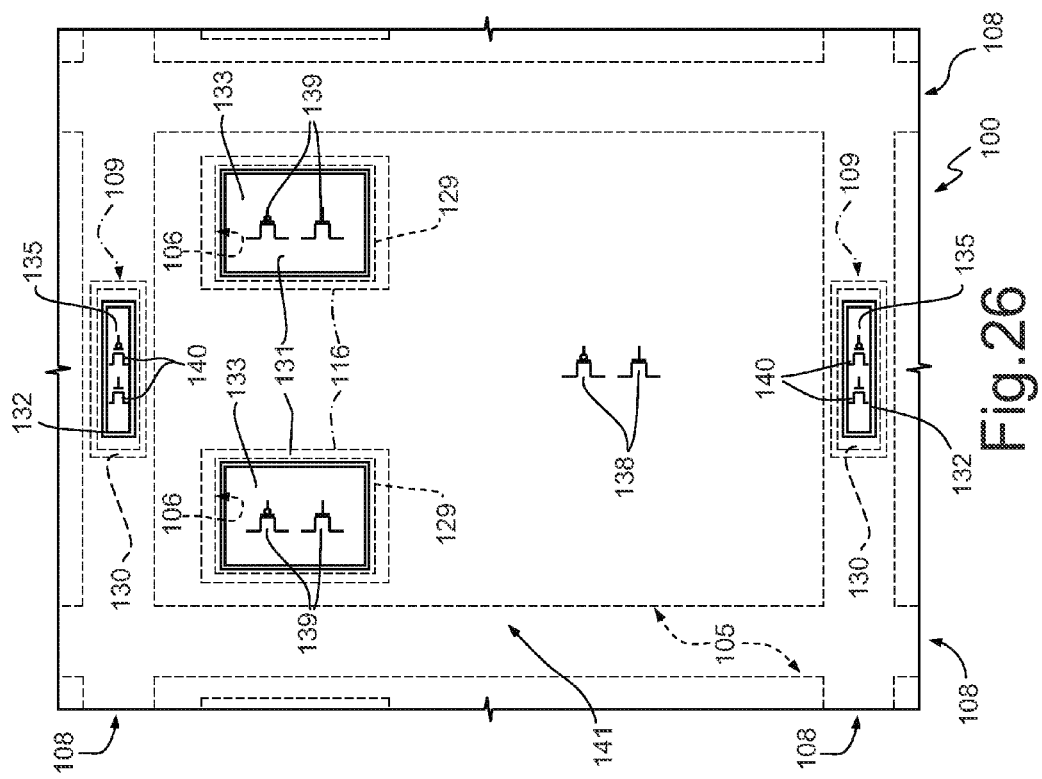

PROCESS FOR MANUFACTURING A SEMICONDUCTOR WAFER HAVING SOI-INSULATED WELLS AND SEMICONDUCTOR WAFER THEREBY MANUFACTURED

PRIORITY CLAIM

The present application is a divisional of copending U.S. patent application Ser. No. 11/879,738, filed Jul. 17, 2007, which application claims priority from European Patent Application No. 06425494.9, filed Jul. 17, 2006, each of the foregoing applications are incorporated herein by reference in their entireties.

TECHNICAL FIELD

Embodiments of the present disclosure relate to a process for manufacturing a semiconductor wafer having SOI-insulation wells, and to a semiconductor wafer thus manufactured.

BACKGROUND

As is known, the processes for manufacturing semiconductor wafers of a silicon-on-insulator (SOI) type are costly, because in most cases they require the use of two starting substrates, which are bonded to one another, for each unit of finished product (final SOI wafer).

Processes have also been proposed, which, starting from an individual wafer, enable a buried oxide layer to be provided, arranged between two monocrystalline semiconductor layers (a substrate and an epitaxial layer). These processes envisage opening a plurality of trenches, for example arranged in a comb-like configuration, in a semiconductor substrate (for example, monocrystalline silicon), except along scribing lines. Then, the trenches are closed by growth of a monocrystalline epitaxial layer. Buried cavities are thus formed, which are remodeled by a thermal "annealing" process. Annealing exploits the deoxidizing atmosphere rich in hydrogen, which has remained trapped inside the buried cavities during the epitaxial growth. During this step, the silicon delimiting the buried cavities redistributes according to a minimum-energy configuration, and the walls that separate adjacent buried cavities are thinned out. The cavities assume the form of channels having a substantially circular cross section, which separate the substrate from the epitaxial layer. After opening trenches that enable access to the buried channels from outside, a thermal oxidation step is carried out, in which the walls between adjacent buried channels are completely converted into silicon oxide. In addition, the oxide grows towards the inside of the buried channels, which are thus filled. In this way, an oxide layer that is substantially continuous and of controlled thickness is obtained, arranged between the substrate and the epitaxial layer.

The SOI wafers thus made are very well suited for providing integrated circuits, both on account of the high crystallographic quality of the epitaxial layer and on account of the high insulation from the substrate.

Very often, however, it is useful to integrate, in the same semiconductor die, also power devices, which, during normal operation, cause a considerable heating and can lead to problems of heat dissipation. In these cases, SOI-type insulation is disadvantageous because the continuous buried oxide layer hinders dispersion of the heat through the substrate.

SUMMARY

Embodiments of the present disclosure provide a process for manufacturing a semiconductor wafer, a process for manufacturing a semiconductor device, a semiconductor wafer, and a semiconductor device that enable the above described limitations to be overcome.

BRIEF DESCRIPTION OF THE DRAWINGS

For a better understanding of the disclosure, some embodiments thereof will now be described, purely by way of non-limiting example and with reference to the attached drawings, wherein:

FIGS. 8, 9, and 10 show respectively the views of FIGS. 5, 6, and 7 in a subsequent manufacturing step;

FIGS. 11a-11c show an enlarged detail of FIG. 9 in subsequent manufacturing steps;

FIG. 12 is a top plan view of the wafer of FIGS. 8-10 in a subsequent manufacturing step;

FIG. 13 is a cross section through the wafer of FIG. 12, taken according to the line XIII-XIII of FIG. 12;

FIG. 14 is a cross section through the wafer of FIG. 12, taken according to the line XIV-XIV of FIG. 12;

FIG. 16 is a cross section through the wafer of FIG. 15, taken according to the line XVI-XVI of FIG. 15;

FIG. 17 is a cross section through the wafer of FIG. 15, taken according to the line XVII-XVII of FIG. 15;

FIGS. 20-23 are top plan views of a semiconductor wafer in successive steps of a manufacturing process according to a second embodiment of the present disclosure;

FIG. 24 is a cross section through the wafer of FIG. 23, taken according to the line XXIV-XXIV of FIG. 23;

FIG. 25 is a cross section through the wafer of FIG. 23, taken according to the line XXV-XXV of FIG. 23;

FIG. 26 is a top plan view of the wafer of FIGS. 23-25, in a subsequent manufacturing step; and FIG. 27 is a top plan view of a die obtained by cutting the wafer of FIG. 26.

DETAILED DESCRIPTION

The following discussion is presented to enable a person skilled in the art to make and use the disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Figure 1:
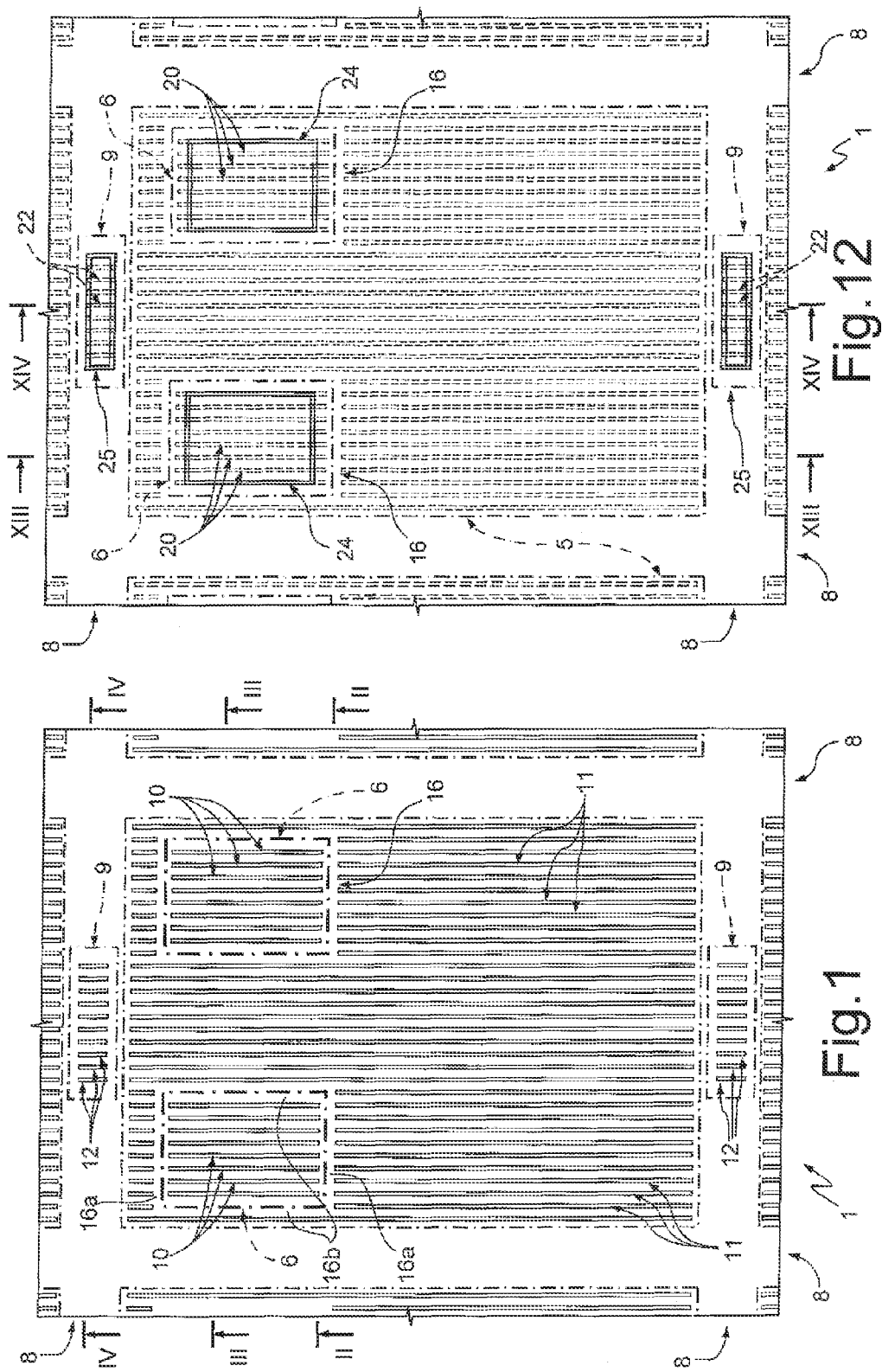
FIG. 1 is a top plan view of a semiconductor wafer in an initial step of a manufacturing process according to a first embodiment of the present disclosure.

With reference to FIGS. 1-4, a semiconductor wafer 1 comprises a substrate 2, for example monocrystalline silicon, which is initially subjected to a first trench etch using a trench mask 3 (not illustrated, for convenience, in FIG. 1). The trench mask 3 is shaped so that, during the first trench etch, the following regions (illustrated with dashed-and-dotted lines in FIG. 1) are defined in the substrate 2:

die regions 5, designed to be separated from one another to form chips or "dice", at the end of a process of machining of the wafer 1 (herein not described in detail);

closed regions 6, internal to respective die regions 5;

scribing lines 8, arranged between adjacent die regions 5; and test regions 9, internal to respective scribing lines 8 and designed to house electronic test components.

Figure 2:
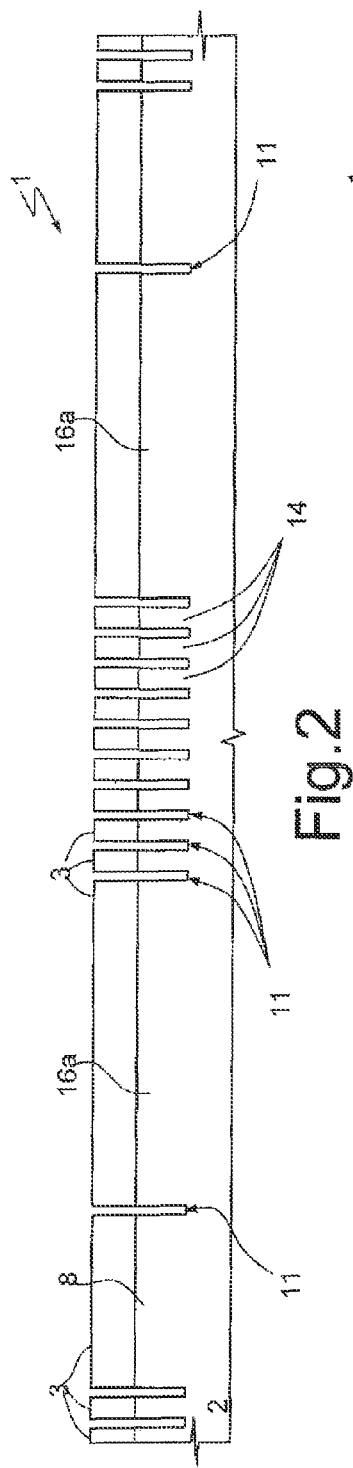
FIG. 2 is a cross section through the wafer of FIG. 1, taken according to the line II-II of FIG. 1.
Figure 3:
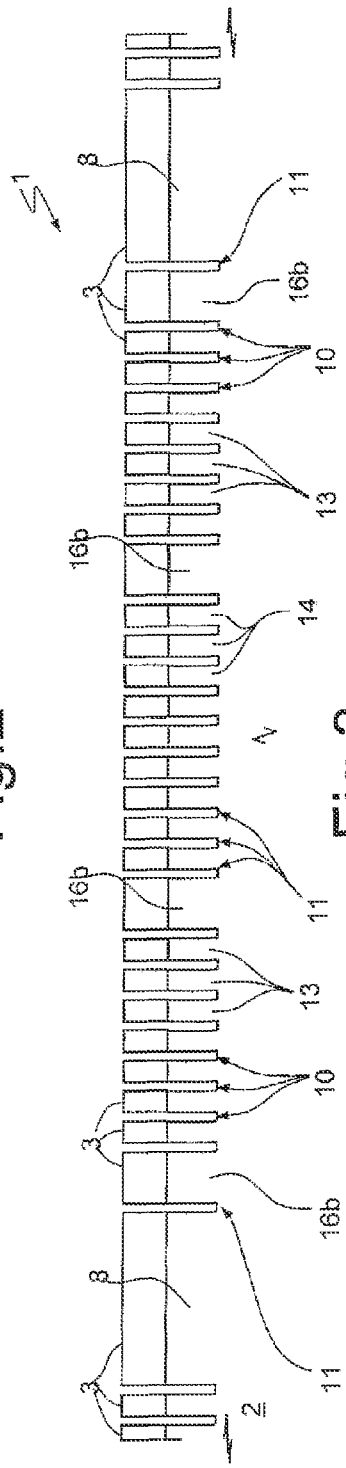
FIG. 3 is a cross section through the wafer of FIG. 1, taken according to the line III-Ill of FIG. 1.
Figure 4:
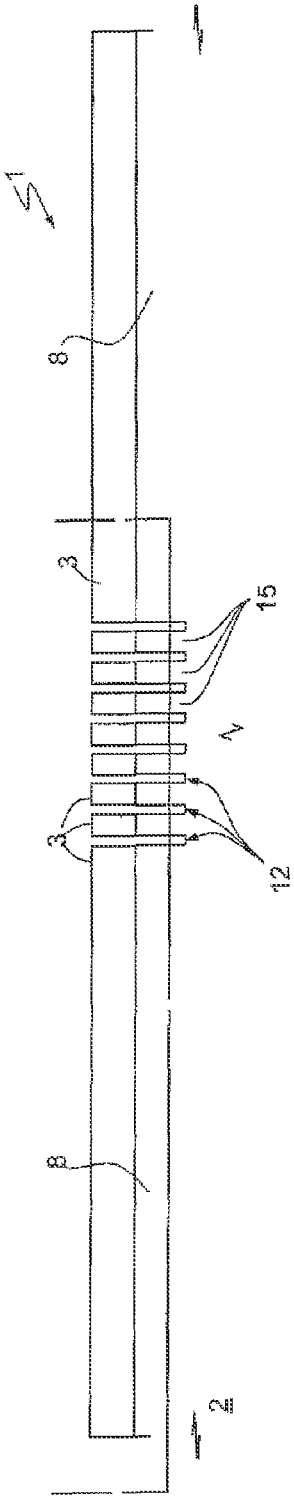
FIG. 4 is a cross section through the wafer of FIG. 1, taken according to the line IV-IV of FIG. 1.

During the first trench etch, first, second, and third rectilinear trenches 10, 11, 12, parallel to one another, are opened in the closed regions 6, in the die regions 5 on the outside of the closed regions 6, and in the test regions 9, respectively. The first, second, and third trenches 10, 11, 12 are arranged in a comb-like configuration and separate from one another first, second, and third diaphragms 13, 14, 15, respectively, arranged adjacent to one another in respective arrays. In particular, the first trenches 10 are uniformly distributed inside the closed regions 6 and are confined within continuous frames 16, which extend along closed polygonal lines and are defined during the first trench etch. Likewise, the second trenches 11 are uniformly distributed throughout the extension of the die regions 5, outside the active-area regions 6 and the frames 16 (FIGS. 1-3). Consequently, the frames 16 separate the first trenches 10 from the surrounding second trenches 11 (FIGS. 1 and 3). More precisely, each frame 16 comprises transverse walls 16a, which delimit the first trenches 10 (and also second trenches 11) longitudinally, and side walls 16b, which separate the outermost first trenches 10 of each closed region 6 from the second adjacent trenches 11. In practice, the transverse barriers 16a and the side walls 16b are made, protecting the substrate 2 with respective portions of the mask 3 so as to selectively preserve the integrity of corresponding portions of the substrate 2 itself (FIGS. 1-3). The third trenches 12 are uniformly distributed inside the test regions 9 and are confined in the respective scribing lines 8. The scribing lines 8 are instead continuous outside the test regions 9.

Figure 5:
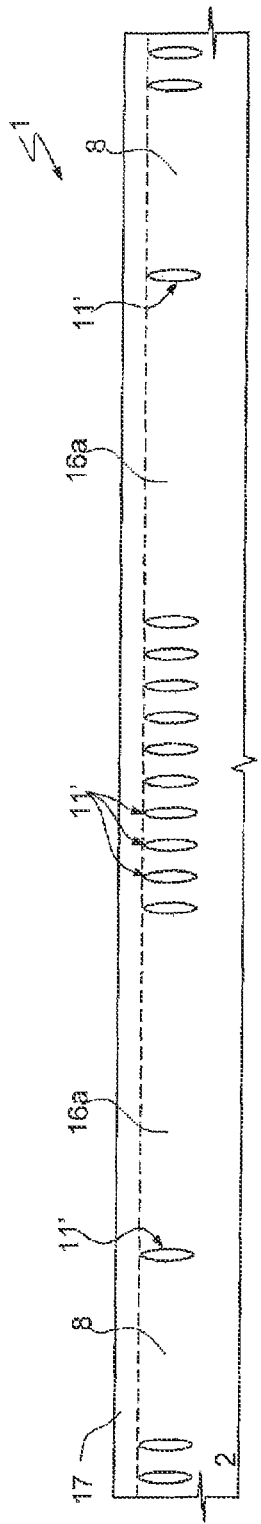
FIGS. 5, 6, and 7 show respectively the views of FIGS. 2, 3, and 4 in a subsequent manufacturing step.
Figure 6:
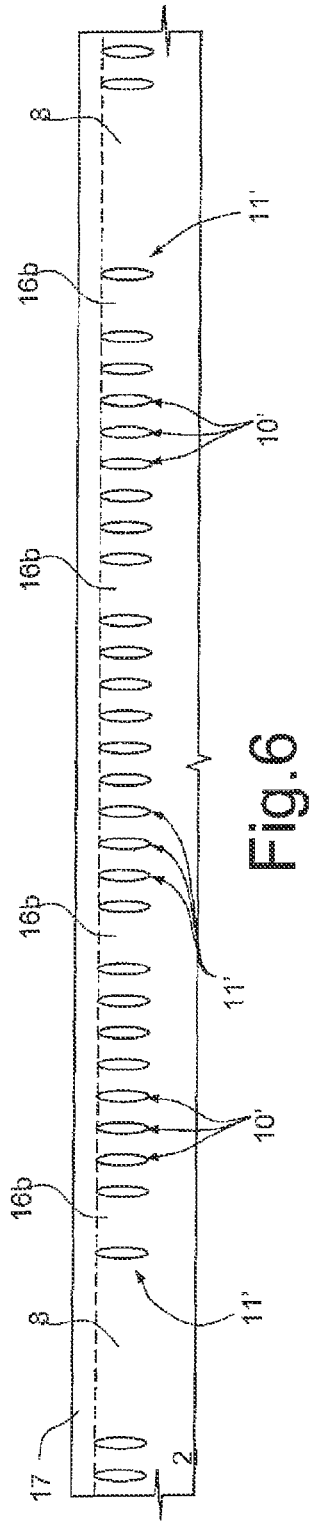
Figure 7:
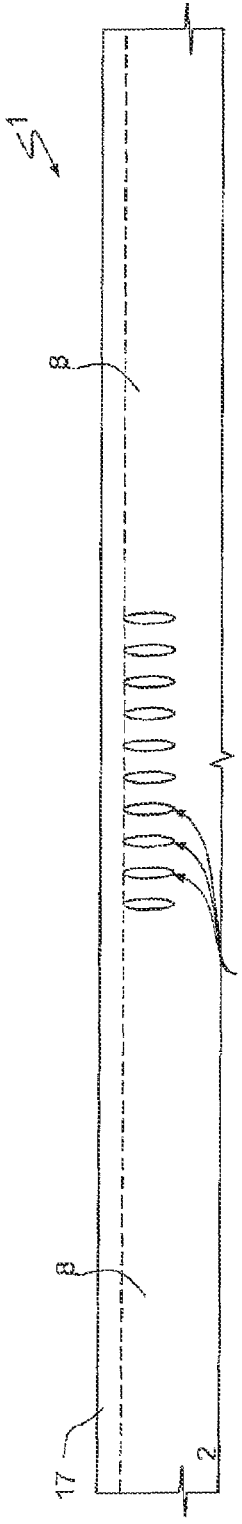

As is shown in FIGS. 5-7, the trench mask 3 is then removed and an epitaxial layer 17 is grown, which closes the first, second, and third trenches 10, 11, 12 to form first, second, and third buried cavities 10', 11', 12', respectively, completely surrounded by silicon.

With reference to FIGS. 8-10, a first thermal annealing step is then carried out, in which the cross section of the first, second, and third buried cavities 10', 11', 12' is modified. The first annealing step exploits the deoxidizing atmosphere rich in hydrogen that has remained trapped in the buried cavities 10', 11', 12' during the epitaxial growth. In practice, when the wafer 1 is heated in the deoxidizing atmosphere, the surface silicon atoms that surround the buried cavities 10', 11', 12' migrate and tend to assume a minimum-energy configuration, as explained in the article "A New Substrate Engineering for the Formation of Empty Space in Silicon (ESS) Induced by Silicon Surface Migration" by T. Sato, N. Aoki, I. Mizushima, and Y. Tsunashima, IEDM 1999, pp. 517-520, which is incorporated herein by reference. For example, if the wafer 1 is heated to 1150° C. for five hours, the first, second, and third buried cavities 10', 11', 12' assume the shape of first, second, and third parallel buried channels 20, 21, 22, respectively, which have a substantially circular cross section and are separated by first, second, and third diaphragms 13', 14', 15', respectively.

The first channels 20 are confined inside the frame 16 and are hence separated from all the second buried channels 21 and are not in communication therewith. Also the third buried channels 22, which are located in the scribing lines 8, are separated both from the first channels 20 and from the second buried channels 21.

After the epitaxial growth and the first annealing step, the surface of the epitaxial layer 17 is not perfectly plane as is, instead, illustrated, for reasons of simplicity, in the previous figures. For this purpose, FIG. 11a shows an enlarged detail of FIG. 9 and highlights the fact that the surface of the epitaxial layer 17 has slight depressions 18 above the buried channels 20, 21, 22, with a difference in level with respect to the scribing lines 8. The depressions 18 can in many cases be neglected. However, if subsequent processing steps envisage highly demanding lithographies (for example, 0.3 μm), difficulties may arise. Preferably, then, the first annealing step is followed by a chemical-mechanical-polishing (CMP) planarization (FIG. 11b), which removes the differences in level around the depressions 18 and renders the surface of the epitaxial layer 17 uniform. In addition, after CMP planarization a second annealing step in a hydrogen atmosphere is carried out (FIG. 11c) in order to further improve the planarity of the surface of the epitaxial layer 17 and correct any possible crystallographic defects, which are shown in an exaggerated way in FIG. 11b. The surface will in any case be considered as being plane in the rest of the description.

As is shown in FIG. 12, a second trench etch is then performed using a further trench mask, here not shown for reasons of simplicity. In this step, first and second access trenches 24, 25 are obtained. The first access trenches 24 extend along closed polygonal lines (for example, rectangular) and are enclosed inside respective frames 16. In addition, the first access trenches 24 are sufficiently deep to reach the first buried channels 20 at their opposite longitudinal ends (FIG. 13). The second access trenches 25, which also extend along closed polygonal lines, are set inside respective test regions 9 and reach in depth the third buried channels 22 (FIG. 14).

Figure 15:
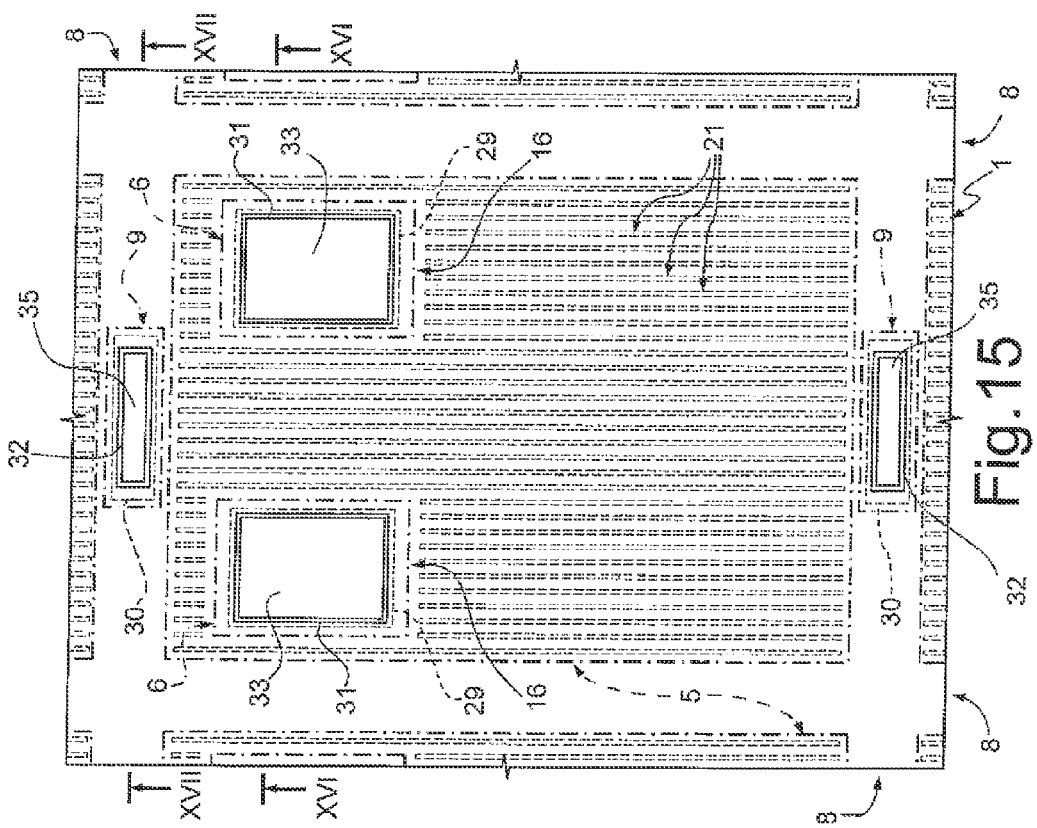
FIG. 15 is a top plan view of the wafer of FIGS. 13 and 14, in a subsequent manufacturing step.
Figure 20:
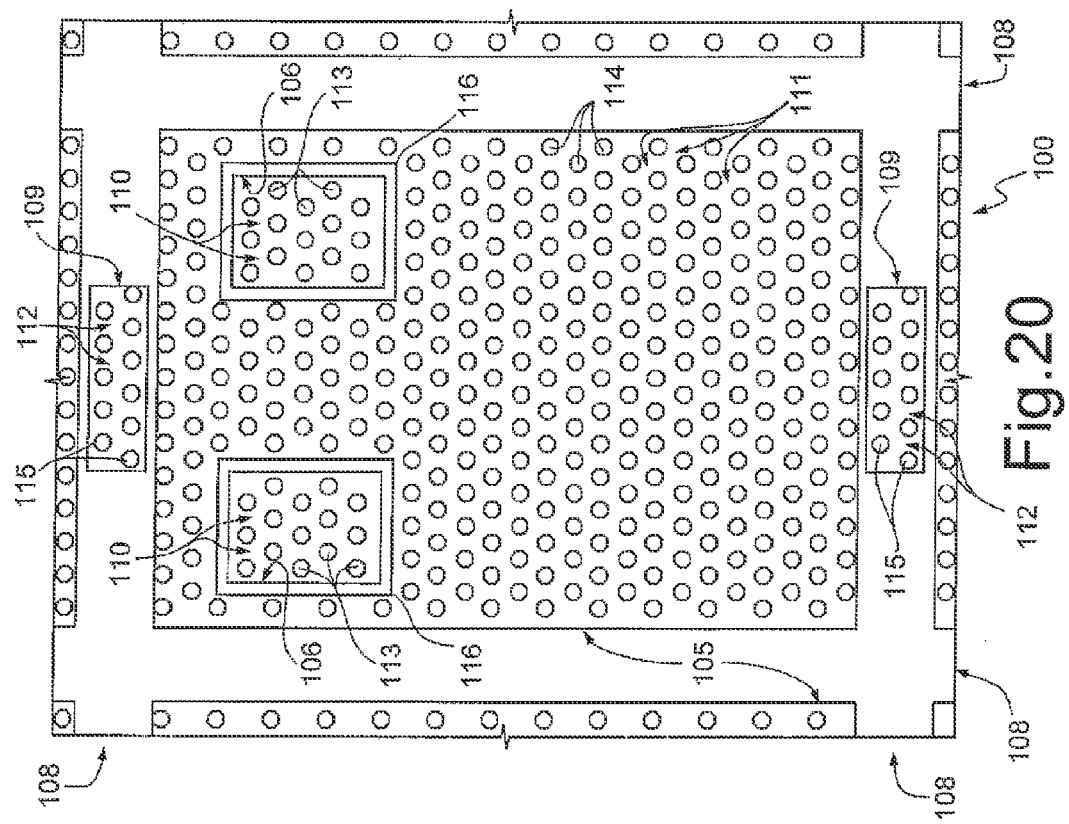

A thermal oxidation of the wafer 1, as shown in FIGS. 15-17, is then carried out. The first buried channels 20 and the third buried channels 22 are accessible from outside (through the first and second access trenches 24, 25, respectively), and hence the silicon surfaces that delimit them are exposed to oxidation. The second buried channels 21, instead, are not accessible and are hence not affected. During oxidation, the first diaphragms 13' and third diaphragms 15' are converted into silicon oxide. The silicon oxide grows also towards the inside of the first buried channels 20 and of the third buried channels 22 and fills them, forming insulating die layers 29 (FIG. 16) and insulating test layers 30 (FIG. 17), buried in the monocrystalline silicon. It may be noted that filling of the first buried channels 20 and of the third buried channels 22 might not be complete (for example, on account of the geometry of the channels themselves). In some cases, in fact, buried air bubbles could remain, which, however, in no way degrade the properties of the insulation layers that are created.

In detail (FIG. 15), the insulating die layers 29 extend inside respective frames 16, whereas the insulating test layers 30 are arranged in the scribing lines 8, within respective test regions 9. Furthermore, also the first and the second access trenches 24, 25 are completely filled with silicon oxide. First and second lateral-insulation structures 31, 32 are thus formed. The first lateral-insulation structures 31 (FIG. 16) are in contact with respective insulating die layers 29 throughout their perimeter and delimit within them active areas 33 of monocrystalline silicon, which include portions of the epitaxial layer 17 and, possibly, of the substrate 2. Likewise, the second lateral-insulation structures 32 (FIG. 17) are in contact with respective insulating test layers 30 along their perimeter and enclose within them test areas 35. The active areas 33 and the test areas 35 are monocrystalline-silicon wells, electrically insulated from the rest of the epitaxial layer 17 and of the substrate 2. In particular, the insulation from the substrate 2 is of the silicon-on-insulator (SOI) type. The portions of the die regions 5 external to the frames 16 (FIG. 16) are, instead, coupled to the substrate 2 through diaphragms 14', which divide the first buried channels 21 from one another and which have not been modified during the step of thermal oxidation.

For reasons of simplicity, moreover, FIGS. 16 and 17 show the wafer 1 after removal of a surface silicon-oxide layer (not illustrated), which has formed during thermal oxidation.

Figure 18:
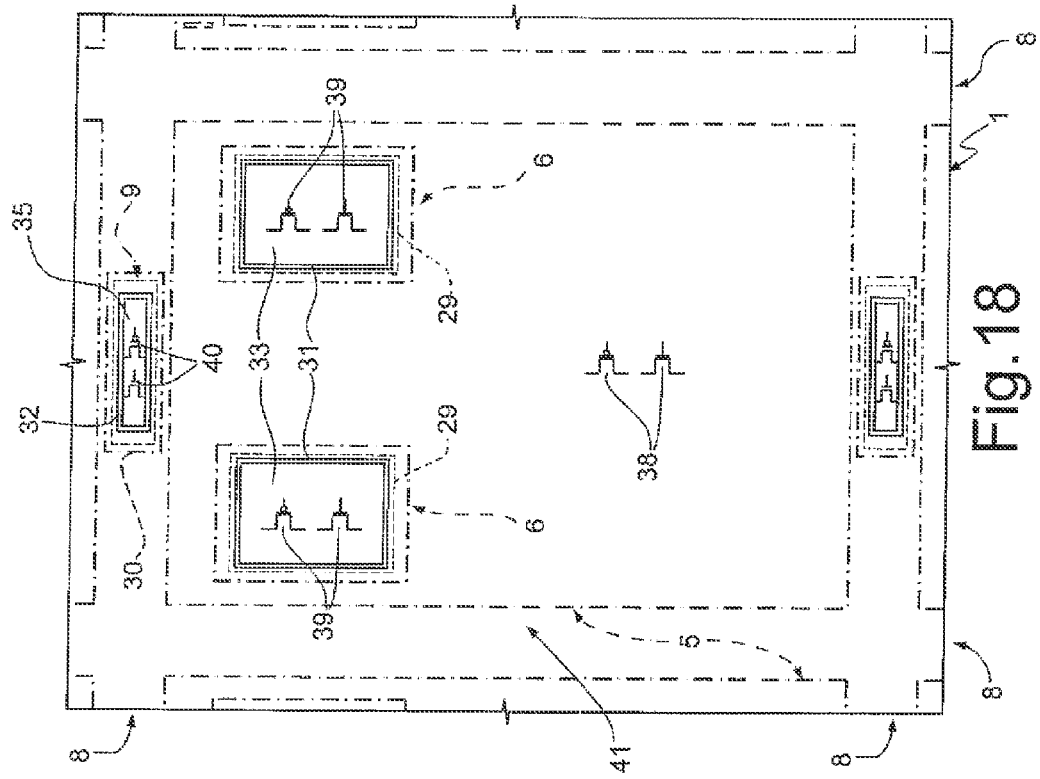
FIG. 18 is a top plan view of the wafer of FIGS. 15-17, in a subsequent manufacturing step.

The wafer 1 is then further processed, as illustrated in FIG. 18. In particular, in the portions of the die regions 5 external to the active areas 33, electronic power components 38 are made, schematically represented by the symbols of NMOS and PMOS transistors (with junction insulation). Inside the active areas 33, which are provided with SOI insulation, signal circuits 39 (i.e., ones operating at low power) are instead made, which are also schematically represented by the symbols of NMOS and PMOS transistors. Furthermore, in the test areas 35 test components 40 are made, identical to corresponding components included in the signal circuits 39. At this point, each die region 5 comprises a complete electronic device 41, which integrates signal circuits 39 in active areas 33 with SOI insulation and electronic power components 38 with junction insulation.

Figure 19:
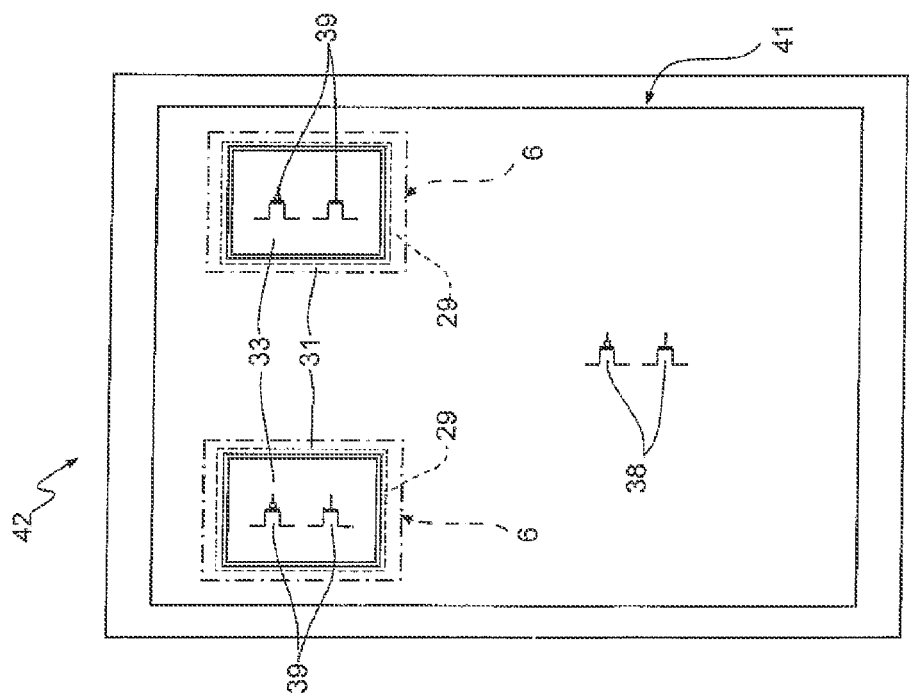
FIG. 19 is a top plan view of a die obtained by cutting the wafer of FIG. 18.

Finally (FIG. 19), after operation of the test components 40 has been electrically tested, the wafer 1 is cut along the scribing lines 8 and split into dice 42, each comprising a respective electronic device 41. The test components 40 are, instead, destroyed during cutting.

The process described advantageously enables provision of semiconductor wafers with SOI-insulation monocrystalline wells and regions in which the continuity of the semiconductor material is preserved between the substrate and the epitaxial layer. These wafers facilitate integration of power components and signal circuits. The SOI-insulation wells are in fact suitable for housing the signal circuits. The power components can be, instead, obtained in areas without SOI insulation, which enable an effective dispersion of the heat produced during normal operation. In this way, any high-frequency disturbance due to the sensitivity of the components to thermal variations is also reduced.

Extending the buried channels to the entire extension of the die regions leads to further advantages. First of all, the so-called "loading effect" is substantially eliminated. By "loading effect" is meant the fact that the rate of the trench etches (and hence also the final depth of the trenches made) depends upon the percentage of exposed silicon surface. Consequently, in order to obtain trenches of equal depth in devices with different geometries, it is normally necessary to reset the etching parameters. According to the above described solution, instead, the area exposed during the first trench etch is substantially independent of the geometry of the devices to be made (approximately 50% of the die regions). Just one calibration is hence sufficient for providing trenches of the desired depth, whatever the geometry of the devices to be produced.

In the second place, the likelihood of defectiveness forming in the areas of transition between the SOI-insulation wells and the regions in which the silicon is continuous and the buried oxide is absent is drastically reduced.

The surface of the wafer presents a good planarity already immediately after the growth of the epitaxial layer. However, CMP planarization completely eliminates steps and depressions from the surface of the epitaxial layer and enables highly advanced photolithographic processes to be carried out with resist thicknesses that are much lower.

The test components are provided with the same type of insulation, obtained in the same ways, which also the components of the signal circuits are provided with. Advantageously, then, the manufacturing and operation conditions are the same, and the reference offered by the test components is more reliable.

FIGS. 20-27 show a second embodiment of the disclosure. In this case, a semiconductor wafer 100 comprises a substrate 102, which is initially subjected to a first trench etch using a trench mask (here not illustrated). The trench mask is shaped in such a way that, during the first trench etch in the substrate 102 the following regions (FIG. 20) are defined:

die regions 105, designed to be separated from one another to form dice, at the end of a process of machining of the wafer 100 (here not described in detail);

closed regions 106, internal to respective die regions 105 and designed to house electronic signal components;

scribing lines 108, arranged between adjacent die regions 105; and test regions 109, internal to respective scribing lines 108 and designed to house electronic test components.

During the first trench etch, first, second, and third trenches 110, 111, 112 are dug in the closed regions 106, in the die regions 105 on the outside of the closed regions 106, and in the test regions 109, respectively. In greater detail, the silicon of the substrate 102 is etched so as to leave arrays of first, second, and third adjacent pillars 113, 114, 115, for example hexagonal and arranged according to a honeycomb pattern, in each of the first, second, and third trenches 110, 111, 112, respectively. The pillars 113, 114, 115 are uniformly distributed with a spacing such that the surface occupied by the pillars 113, 114, 115 themselves is approximately equal to the free surface inside the die regions 105 of the active-area regions 106 and of the test regions 109. In addition, by the first trench etch, frames 116 are made, which extend along closed polygonal lines (for example rectangular) and delimit respective closed regions 106.

With reference to FIG. 21, after an epitaxial layer 117 has been grown, which closes the trenches 110, 111, 112 to form first, second, and third buried cavities 110', 111', 112', respectively, substantially as described previously, a first thermal annealing process is performed, exploiting the deoxidizing atmosphere trapped in the buried cavities 110', 111', 112' during the epitaxial growth. In this step the pillars 113', 114', 115' are remodeled, thinning out at the centre. It may be noted that, after the epitaxial growth, the first buried cavities 110' and the second buried cavities 111' are separated by the frames 116 and do not communicate with one another.

The first annealing step is followed by a CMP planarization and by a second annealing step (not shown in detail) to render the surface of the epitaxial layer 117 regular and to eliminate any possible differences in level and imperfections.

Next (FIG. 22), first and second access trenches 124, 125 are opened by means of a second trench etch. The first access trenches 124 extend along closed polygonal lines (for example rectangular), are enclosed inside respective frames 116 and reach respective first buried cavities 110'. The second access trenches 125, which also extend along closed polygonal lines, are arranged inside respective test regions 109 and reach respective third buried cavities 112'.

A thermal oxidation of the wafer 100 is then carried out (FIGS. 23-25). The first buried cavities 110' and the third buried cavities 112' are accessible from outside (through the first and the second access trenches 124, 125, respectively), and hence the silicon surfaces that delimit them are exposed to oxidation. The second buried cavities 111', instead, are not accessible and are hence not affected. During oxidation, the first pillars 113' and the third pillars 115' present in the first buried cavities 110' and in the third buried cavities 112', respectively, are converted into silicon oxide. In addition, the first buried cavities 110' and the third buried cavities 112' are filled by the silicon oxide (possibly, buried air bubbles may remain). There are thus formed insulating die layers 129 (FIGS. 23 and 24) inside respective frames 116 (which are also at least in part converted into silicon oxide), and insulating test layers 130 (FIGS. 23 and 25) within the scribing lines 108, inside respective test regions 109. In addition, the first and second access trenches 124, 125 are completely filled with silicon oxide. First and second lateral-insulation structures 131, 132 are thus formed. The first lateral-insulation structures 131 are in contact with respective insulating die layers 129 throughout their perimeter and delimit within them active areas 133 of monocrystalline silicon (FIGS. 23 and 24). Likewise, the second lateral-insulation structures 130 are in contact with respective insulating test layers 130 along their perimeter, and enclose within them test areas 135 (FIGS. 23 and 25). The active areas 133 and the test areas 135 are monocrystalline-silicon wells electrically insulated from the rest of the epitaxial layer 117 and of the substrate 102. In particular, the insulation from the substrate 102 is of the silicon-on-insulator (SOI) type.

The wafer 100 is then further machined as illustrated in FIG. 26. In particular, in the portions of the die regions 105 external to the active areas 133, electronic power components 138 (with junction insulation) are made. Inside the active areas 133, which are provided with SOI insulation, signal circuits 139 are instead made. Furthermore, in the test areas 135 test components 140 are made. At this point, each die region 105 comprises a complete electronic device 141, integrating signal circuits 139 in active areas 133 with SOI insulation and electronic power components 138 with junction insulation.

Finally (FIG. 27), after operation of the test components 140 has been electrically tested, the wafer 100 is cut along the scribing lines 108 and split into dice 142, each comprising a respective electronic device 141.

The dice 42, 142 including the formed signal, test, and power components can be packaged and utilized in a variety of different types of electronic systems, such as control systems, automotive systems, communications systems, computer systems, and so on.

Finally, it is evident that modifications and variations can be made to the process, to the wafer, and to the device described herein, without thereby departing from the scope of the present disclosure, as defined in the annexed claims. In particular, the number and shape of the buried dielectric layers and of the SOI-insulation wells obtained in each die region are arbitrary parameters and are not limited to the embodiments described.

From the foregoing it will be appreciated that, although specific embodiments of the disclosure have been described herein for purposes of illustration, various modifications may be made without deviating from the spirit and scope of the disclosure.

The invention claimed is:

1. A semiconductor wafer comprising a semiconductor body including a die region;

wherein the semiconductor wafer further comprises:
a first epitaxial semiconductor region;
a first buried dielectric layer occupying a portion of the die region extending underneath the first epitaxial semiconductor region, said first buried dielectric layer extending to completely surround peripheral side edges of the first epitaxial semiconductor region so as to insulate the first epitaxial semiconductor region from the semiconductor wafer;
a second epitaxial semiconductor region; and
buried cavities disposed underneath the second epitaxial semiconductor region, each of said buried cavities defining an open space which is completely surrounded by material of the semiconductor body and the second epitaxial semiconductor region.

2. The wafer according to claim 1, further comprising;
a third epitaxial semiconductor region; and
a second buried dielectric layer occupying a portion of the semiconductor wafer within a scribing line outside the die region and extending underneath the third epitaxial semiconductor region, said second buried dielectric layer extending to completely surround side peripheral side edges of the third epitaxial semiconductor re ion so as to insulate the third epitaxial region from the semiconductor wafer.

3. The semiconductor wafer of claim 2 further comprising at least one MOS transistor disposed in the third epitaxial semiconductor region.

4. The semiconductor wafer of claim 1 wherein the first and second epitaxial semiconductor regions have a monocrystalline silicon structure.

5. The semiconductor wafer of claim 1 wherein the first buried dielectric layer electrically isolates the first epitaxial semiconductor region from the semiconductor body.

6. The semiconductor wafer of claim 1 further comprising at least one MOS transistor disposed in the first epitaxial semiconductor region.

7. The semiconductor wafer of claim 1 further comprising a power component disposed in the second epitaxial semiconductor region.

8. A semiconductor device comprising a semiconductor body, wherein the device further comprises:
epitaxial semiconductor material;
a buried dielectric layer occupying a portion of the semiconductor body underneath the epitaxial semiconductor material; and
buried cavities adjacent to and separate from the buried dielectric layer, said buried cavities disposed underneath the epitaxial semiconductor material and defining open spaces which are completely surrounded by the semiconductor body and the epitaxial semiconductor material, said buried cavities forming a plurality of separate parallel extending channels buried under the epitaxial semiconductor material.

9. A semiconductor die, comprising:
a substrate;
an epitaxial semiconductor layer formed over the substrate;
a buried insulation layer formed under a first active portion of the epitaxial semiconductor layer in a selected region of the substrate;
a first lateral insulation structure extending through the epitaxial semiconductor layer and surrounding said first active portion of the epitaxial semiconductor layer;
signal components formed in the first active portion; and
buried cavities formed in the substrate in regions other than the selected region, said buried cavities disposed underneath the epitaxial semiconductor layer and defining open spaces which are completely surrounded solely by material of the substrate and the epitaxial semiconductor layer, said open spaces defining separate parallel extending channels.

10. The semiconductor die of claim 9 wherein test components are formed in at least a second active portion of the epitaxial semiconductor layer.

11. The semiconductor die of claim 10 further comprising scribe lines that intersect the test components.

12. The semiconductor die of claim 10 wherein the second active portion is electrically isolated from the substrate.

13. The semiconductor die of claim 9 wherein the signal components comprise MOS transistors.

14. The semiconductor die of claim 9 wherein the buried insulation layer and first lateral insulation structure comprise silicon oxide.

15. The semiconductor die of claim 9 further comprising power components formed adjacent the buried cavities in portions of the epitaxial semiconductor layer other than the first active portion.

16. The semiconductor die of claim 9 wherein the first active portion further comprises monocrystalline silicon.

17. The semiconductor die of claim 9 further comprising a second lateral insulation structure extending through the epitaxial semiconductor layer, the second lateral insulation structure surrounding a second active portion of the epitaxial semiconductor layer that is different from the first active portion.

18. An electronic system, comprising:
electronic circuitry; and
a first semiconductor die coupled to the electronic circuitry, the first semiconductor die including,
a substrate;
an epitaxial semiconductor layer formed over the substrate;
buried insulation layers formed in selected regions of the substrate underneath the epitaxial semiconductor layer;
for each buried insulation layer, a first lateral insulation structure extending through the epitaxial semiconductor layer and surrounding a first active portion of the epitaxial semiconductor layer;
signal components formed in the first active portions; and
buried cavities formed in the substrate in regions other than the selected regions, said buried cavities disposed underneath the epitaxial semiconductor layer and defining open spaces which are completely surrounded solely by material of the substrate and the epitaxial semiconductor layer; and
transistor components formed adjacent the buried cavities in portions of the epitaxial semiconductor layer other than the first active portions.

19. The electronic system of claim 18 wherein the electronic circuitry comprises control circuitry.

20. The electronic system of claim 18, further comprising a second semiconductor die coupled to the electronic circuitry, the second semiconductor die separate from the first semiconductor die.

21. The electronic system of claim 18, further comprising packaging that houses at least the first semiconductor die.

* * * * *

UNITED STATES PATENT AND TRADEMARK OFFICE
CERTIFICATE OF CORRECTION

PATENT NO. : 9,105,690 B2  
APPLICATION NO. : 13/023039  
DATED : August 11, 2015  
INVENTOR(S) : Gabriele Barlocchi et al.

Page 1 of 1

It is certified that error appears in the above-identified patent and that said Letters Patent is hereby corrected as shown below:

In the Specification:

At column 2, line number 17, please replace [III-Ill] with -- III-III --.

In the Claims:

At column 8, claim number 2, line number 22, please delete the word "side".

At column 8, claim number 2, line number 23, please replace the words [re ion] with the word -- region --.

Signed and Sealed this  
Twenty-sixth Day of January, 2016

Michelle K. Lee  
*Director of the United States Patent and Trademark Office*